United States Patent
Chang et al.

(10) Patent No.: US 8,586,175 B2
(45) Date of Patent: Nov. 19, 2013

(54) ARTICLE HAVING HARD FILM AND METHOD FOR MAKING THE ARTICLE

(75) Inventors: Hsin-Pei Chang, Tu-Cheng (TW); Wen-Rong Chen, Tu-Cheng (TW); Huann-Wu Chiang, Tu-Cheng (TW); Cheng-Shi Chen, Tu-Cheng (TW); Li-Quan Peng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 168 days.

(21) Appl. No.: 13/162,708

(22) Filed: Jun. 17, 2011

(65) Prior Publication Data

US 2012/0164436 A1 Jun. 28, 2012

(30) Foreign Application Priority Data

Dec. 24, 2010 (CN) .......................... 2010 1 0604423

(51) Int. Cl.
*B32B 9/00* (2006.01)
(52) U.S. Cl.
USPC ........... 428/216; 428/336; 428/469; 428/472; 428/697; 428/698; 428/699

(58) Field of Classification Search
USPC .......... 428/216, 336, 469, 472, 697, 698, 699
See application file for complete search history.

(56) References Cited

U.S. PATENT DOCUMENTS

| 4,643,951 | A  | * | 2/1987 | Keem et al. | .................. | 428/469 |
| 6,077,596 | A  | * | 6/2000 | Hashimoto et al. | ........... | 428/216 |
| 7,923,130 | B2 | * | 4/2011 | Shibata et al. | ................ | 428/697 |
| 7,947,363 | B2 | * | 5/2011 | Xu et al. | ...................... | 428/698 |

OTHER PUBLICATIONS

Barshilla et al "Growth and characterization of TiAlN/CrAlN superlattices prepared by reactive direct current magnetron suptter-ing" J. Vac Technol. A 27(1) (2009) p. 29-36.*

* cited by examiner

*Primary Examiner* — Archene Turner
(74) *Attorney, Agent, or Firm* — Altis & Wispro Law Group, Inc.

(57) ABSTRACT

An article includes a substrate and a hard film formed on the substrate; the hard film includes a plurality of complex layers and a plurality of Ni layers, each complex layer and Ni layer alternately arranged; each complex layer includes a plurality of TiAlN layers and a plurality of CrAlN layers, each TiAlN layer alternately arranged with each CrAlN layer. The disclosure also described a method to make the article.

11 Claims, 3 Drawing Sheets

ARTICLE HAVING HARD FILM AND METHOD FOR MAKING THE ARTICLE

CROSS-REFERENCE TO RELATED APPLICATIONS

This application is related to co-pending U.S. patent application Ser. No. 13/164,278 entitled "ARTICLE HAVING HARD FILM AND METHOD FOR MAKING THE ARTICLE". Such application has the same assignee as the present application. The above-identified application is incorporated herein by reference.

BACKGROUND

1. Technical Field

The present disclosure relates to an article having hard films and a method for making the article.

2. Description of the Related Art

Hard films are widely applied on surface of the metal alloys, steels and ceramics to fabricate articles with high hardness and high abrasion resistance. Currently, a common hard film is TiAlN film. However, to meet the needs for maximum hardness for special articles, such as cutting tools, the TiAlN film does not meet this requirement for hardness and abrasion resistance.

Therefore, there is room for improvement within the art.

BRIEF DESCRIPTION OF THE DRAWINGS

Many aspects of the present disclosure article having hard film and method for making the article can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
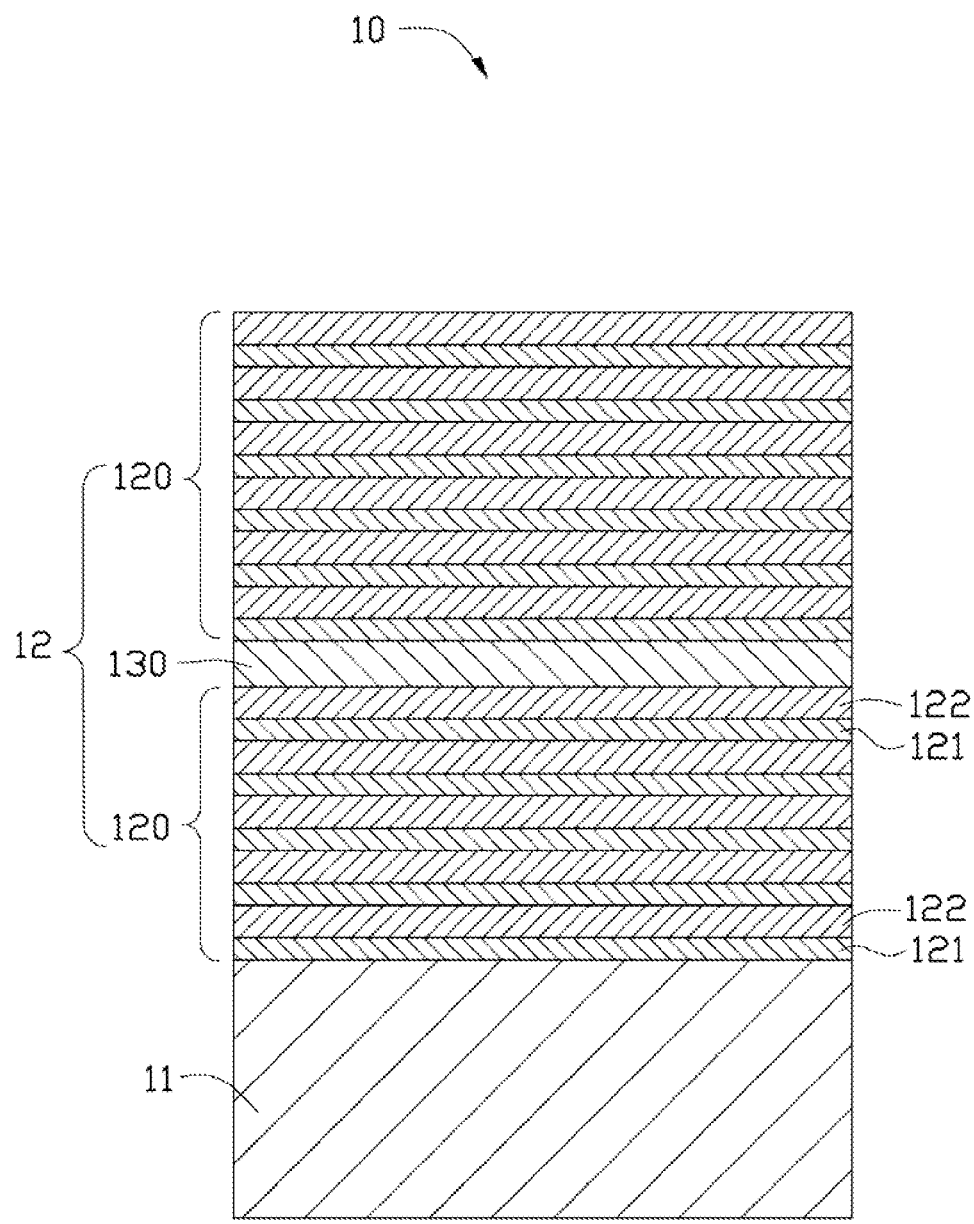
FIG. 1 is a sectional view of an article having hard film according to an exemplary embodiment.

FIG. 1 shows an exemplary embodiment of an article 10. The article 10 includes a substrate 11 and a hard film 12 integrally formed on the external surface of the substrate 11. The substrate 11 can be metal alloy, stainless steel, or ceramic.

The hard film 12 can be formed on the substrate 11 by Physical Vapor Deposition (PVD). The hard film 12 includes a plurality of alternating complex layers 120 and Ni layers 130, each complex layer 120 is alternately arranged with each Ni layer 130. Each complex layer 120 includes a plurality of alternating TiAlN layers 121 and CrAlN layers 122, and each CrAlN layer 122 alternately arranged with each TiAlN layer 121. Each complex layer 120 includes an equal number of TiAlN layers 121 and CrAlN layers 122, typically in the range of about 5-8 of each, having a total thickness in a range from about 8 nanometer (nm) to about 20 nm. Each Ni layer 130 has uniform thickness in a range from about 20 nm to about 40 nm, each Ni layer 130 is located between and transitionally connects two adjacent complex layers 120 to relieve the inner stress of the hard film 12. The hard film 12 has a total thickness in a range from about 1.5 micrometer (μm) to about 3 μm. Since the thermal expansion rate of the TiAlN layer 121/the CrAlN layer 122 is close to the thermal expansion rate of the substrate 11, one of the TiAlN layer 21 or the CrAlN layer 122 is directly formed on the substrate 11, thus avoiding production of large inner stresses during variations in the temperature of the article 10. The TiAlN layer 121 or the CrAlN layer 122 has excellent hardness, thus, a TiAlN layers 121/the CrAlN layer 122 is made the outermost layer of the article 10.

Figure 2:
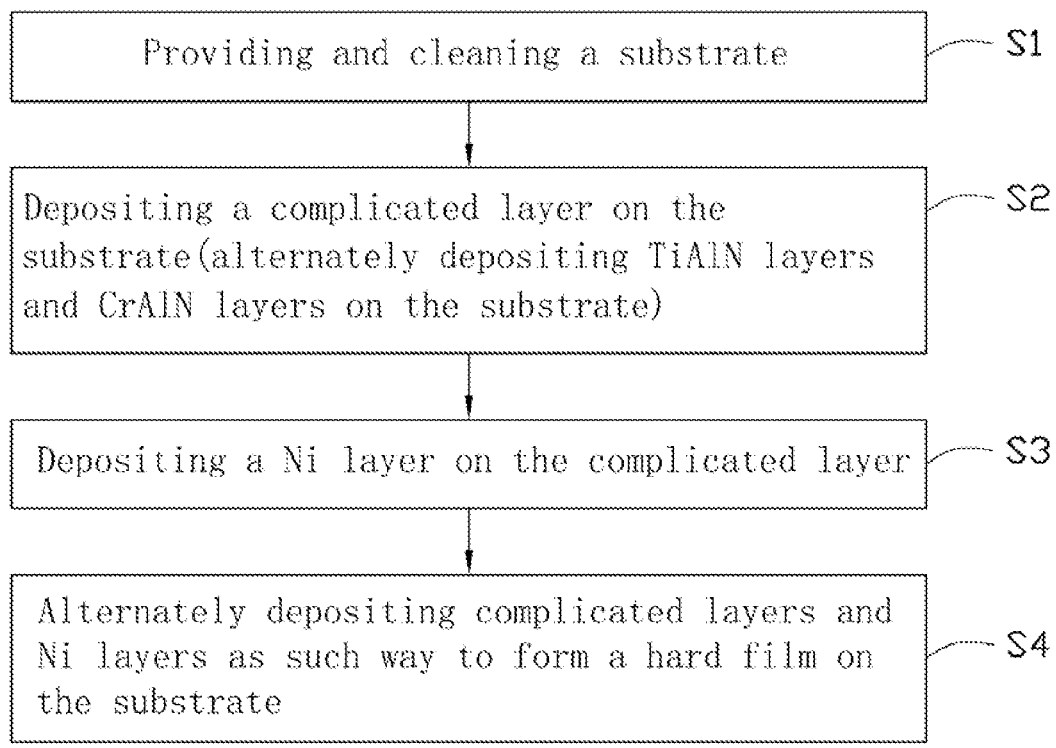
FIG. 2 is a flow chart to fabricate the article shown in FIG. 1.

Referring to FIG. 2, the article 10 can be made from following steps:

Providing a substrate 11. The substrate 11 may be made of metal alloy, steel, or ceramic. The substrate 11 is cleaned by a cleaning solution to clean grease from the surface of the substrate 11. The cleaning solution can be ethanol, acetone and/or other organic solvents. A common ultrasonic cleaning machine can be used for cleaning the substrate 11.

Figure 3:
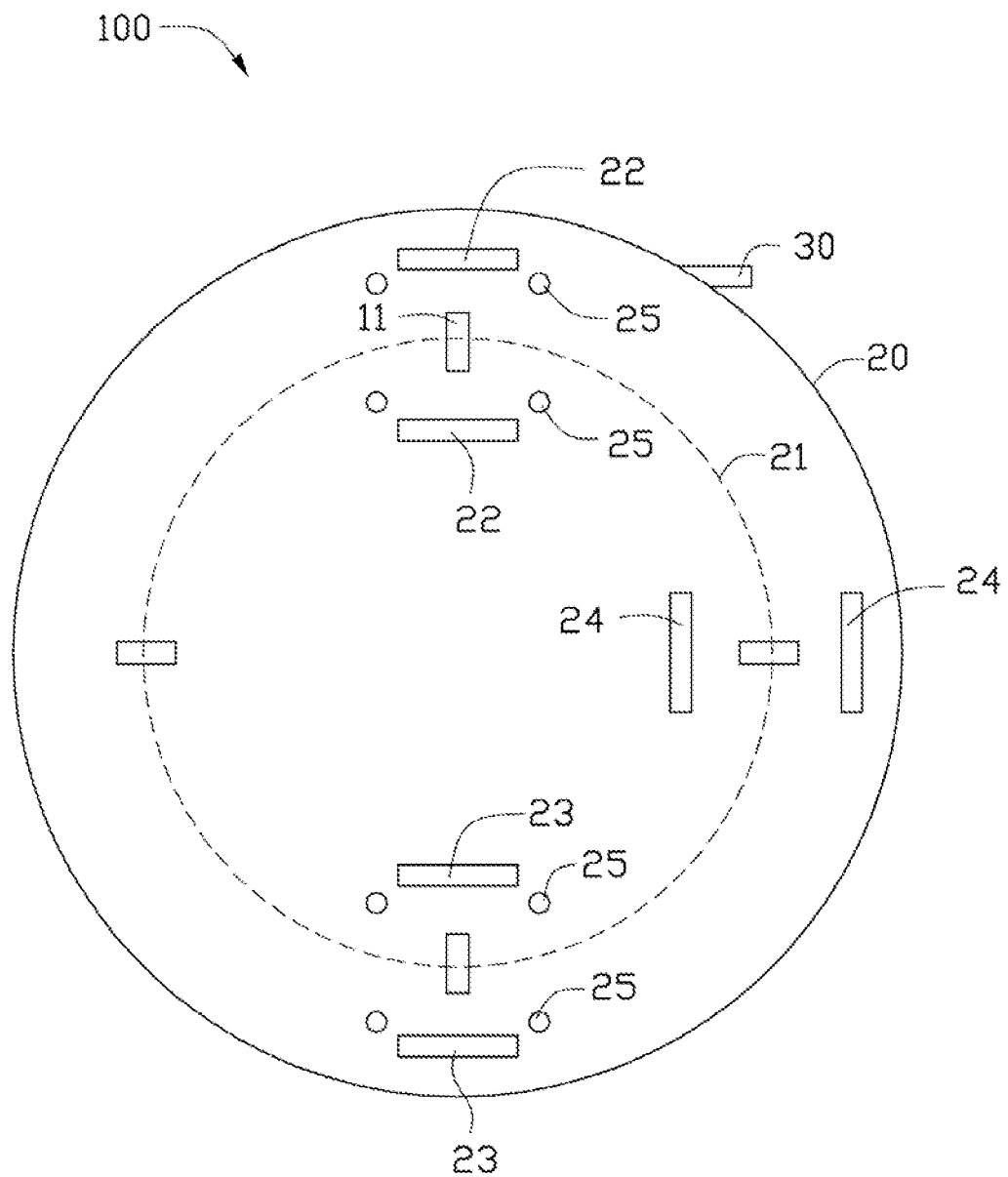
FIG. 3 is a vertical view of a coating machine used to fabricate the article.

Providing a vacuum sputtering coating machine 100 Referring to FIG. 3, the vacuum sputtering coating machine 100 includes a sputtering coating chamber 20 and a vacuum pump 30 connecting to the sputtering coating chamber 20. The vacuum pump 30 is used to pump air out the sputtering coating chamber 20. The vacuum sputtering coating machine 100 further includes a rotating bracket 21, two first targets 22, two second targets 23, two third targets 24, and a plurality of gas inlets 25. The rotating bracket 21 rotates the substrate 11 in the sputtering coating chamber 20 relative to the first targets 22, the second targets 23, and the third targets 24. The two first targets 22 face each other, and are respectively located on opposite sides of the rotating bracket 21, the same as the two second targets 23 and the two third targets 24. In this exemplary embodiment, the first targets 22 are TiAl alloy targets, the second targets 23 are CrAl alloy targets, the third targets 24 are Ni targets.

Cleaning the targets 22, 23 and 24 by argon (Ar) plasma. The vacuum level inside the sputtering coating chamber 20 is set to about $3.0*10^{-3}$ Pa. Argon is fed into the sputtering coating chamber 20 at a flux rate about 500 Standard Cubic Centimeters per Minute (sccm) from the gas inlets 24. A bias voltage applied to the substrate 11 may be between about −250 volts (V) and about −350 volts. The current intensity of the first target 22, the second target 23 and the third targets 24 are respectively set to about 30-50 A (Ampere). The Ar particles strike against and clean the surface of the first targets 22, the second targets 23 and the third targets 24.

Depositing the hard film 12 on the substrate 11 as follows. Depositing the complex layer 120 on the substrate 11. The vacuum level inside the sputtering coating chamber 20 is set to about $3.0*10^{-3}$ Pa. A bias voltage applied to the substrate 11 is adjusted to between about −250 volts and about −450 volts. Argon and Nitrogen ($N_2$) are fed into the sputtering coating chamber 20, with Argon at a flux rate about 300 sccm, and Nitrogen at a flux between about 80 sccm and about 150 sccm. The first targets 22 and the second targets 23 are evaporated respectively at a current intensity between about 30 A and about 45 A. The rotating bracket 21 is started at a speed between about 0.5 revolutions per minute (r/min) and about 3 r/min. The first targets 22 and the second targets 30 in the sputtering coating chamber 20 are alternatively evaporated for a time from about 60 min to about 120 min, to alternatively deposit an equal number of alternating TiAlN layer 121 and CrAlN layer 122 on the substrate 11.

Depositing the Ni layer 130 on the complex layer 120. The third targets 24 are evaporated at a current intensity between about 20 A and about 30 A for a time between about 60 second(s) and about 120 s, to deposit the Ni layer 130 on the complex layer 120.

Alternately depositing the complex layer 120 and the Ni layer 130 as said, to deposit the hard film 12 on the substrate 11, until the hard film 12 has a thickness in range from about 1.5 μm to about 3 μm. The complex layer 120 is directly combined on the substrate 11 and is made the outermost layer of the article 10.

It is to be understood that even though numerous characteristics and advantages of the present embodiments have been set forth in the foregoing description, together with details of assemblies and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. An article, comprising:
   a substrate; and
   a hard film formed on the substrate;
   wherein the hard film includes a plurality of alternating complex layers and Ni layers, each complex layer and Ni layer alternately arranged; each complex layer includes a plurality of alternating TiAlN layers and CrAlN layers, each TiAlN layer alternately arranged with each CrAlN layer.

2. The article as claimed in claim 1, wherein each complex layer includes an equal number of TiAlN layers and CrAlN layers.

3. The article as claimed in claim 2, wherein the equal number of TiAlN layers and CrAlN layers is about 5-8 of each, having a total thickness in a range from 8 nm-20 nm.

4. The article as claimed in claim 1, wherein the hard film has a thickness in a range from 1.5 μm-3 μm.

5. The article as claimed in claim 1, wherein a complex layer is directly formed on the substrate.

6. The article as claimed in claim 1, wherein a complex layer is the outermost layer of the article.

7. The article as claimed in claim 1, wherein the substrate is chosen from a metal alloy, stainless steel, and ceramic.

8. The article as claimed in claim 1, wherein each Ni layer is located between two adjacent complex layers to relieve the inner stress of the hard film.

9. The article as claimed in claim 3, wherein each Ni layer is located between two adjacent complex layers to relieve the inner stress of the hard film.

10. The article as claimed in claim 1, wherein each Ni layer has a thickness in a range from about 20 nm to about 40 nm.

11. The article as claimed in claim 3, wherein each Ni layer has a thickness in a range from about 20 nm to about 40 nm.

* * * * *